(12) United States Patent
Wei et al.

(10) Patent No.: US 11,139,416 B2
(45) Date of Patent: Oct. 5, 2021

(54) METHOD FOR MANUFACTURING LED DISPLAY DEVICE AND LED DISPLAY PANEL

(71) Applicant: CHENGDU VISTAR OPTOELECTRONICS CO., LTD., Sichuan (CN)

(72) Inventors: Dong Wei, Kunshan Suzhou (CN); Xiaolong Yang, Kunshan Suzhou (CN); Jiantai Wang, Kunshan Suzhou (CN); Huashan Chen, Kunshan Suzhou (CN)

(73) Assignee: CHENGDU VISTAR OPTOELECTRONICS CO., LTD., Chengdu (CN)

( * ) Notice: Subject to any disclaimer, the term of this patent is extended or adjusted under 35 U.S.C. 154(b) by 75 days.

(21) Appl. No.: 16/752,988

(22) Filed: Jan. 27, 2020

(65) Prior Publication Data

US 2020/0161500 A1 May 21, 2020

Related U.S. Application Data

(63) Continuation of application No. PCT/CN2019/084386, filed on Apr. 25, 2019.

(30) Foreign Application Priority Data

Aug. 31, 2018 (CN) .......................... 201811013574.7

(51) Int. Cl.
*H01L 33/00* (2010.01)
*G09G 3/32* (2016.01)
(Continued)

(52) U.S. Cl.
CPC ........... *H01L 33/0095* (2013.01); *G09G 3/32* (2013.01); *H01L 25/0753* (2013.01);
(Continued)

(58) Field of Classification Search
CPC ... H01L 33/0095; H01L 33/06; H01L 33/504; H01L 2933/0033; H01L 2933/0041; H01L 25/0753; G09G 3/32
(Continued)

(56) References Cited

U.S. PATENT DOCUMENTS

2015/0255505 A1* 9/2015 Jeoung ................... H05K 1/189
257/89
2016/0163931 A1* 6/2016 Schricker .............. H01L 33/505
257/98
(Continued)

FOREIGN PATENT DOCUMENTS

CN 102315339 A 1/2012
CN 106813209 A 6/2017
(Continued)

*Primary Examiner* — Igwe U Anya
(74) *Attorney, Agent, or Firm* — Maier & Maier, PLLC

(57) ABSTRACT

A method for manufacturing an LED display device and an LED display device are provided. The method includes following operations. An LED array substrate and a conversion plate are provided. The LED array substrate includes a driving layer, a plurality of LED chips arranged in an array on a side of the LED array substrate having the driving layer. The conversion plate includes a substrate and a plurality of light conversion blocks, the plurality of light conversion blocks are spaced apart from each other and arranged on the substrate. A side of the conversion plate having the light conversion blocks is adhered with a side of the LED array substrate having the LED chips correspondingly, such that the light conversion blocks are arranged on corresponded top surfaces of the LED chips. The substrate is removed.

14 Claims, 6 Drawing Sheets

(51) Int. Cl.
    *H01L 25/075* (2006.01)
    *H01L 33/06* (2010.01)
    *H01L 33/50* (2010.01)

(52) U.S. Cl.
    CPC ............ *H01L 33/06* (2013.01); *H01L 33/504* (2013.01); *H01L 2933/0033* (2013.01); *H01L 2933/0041* (2013.01)

(58) Field of Classification Search
    USPC .......................................................... 257/79
    See application file for complete search history.

(56) References Cited

U.S. PATENT DOCUMENTS

2017/0025399 A1* 1/2017 Takeya .................... H05B 33/12
2018/0350871 A1* 12/2018 Lee ........................ H01L 27/156

FOREIGN PATENT DOCUMENTS

| CN | 107068707 A | 8/2017 |
| CN | 107170876 A | 9/2017 |
| CN | 107731864 A | 2/2018 |

\* cited by examiner

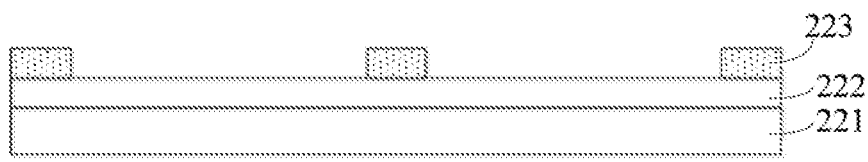
FIG. 3B
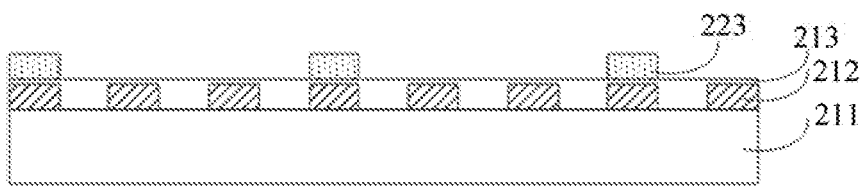
FIG. 3C
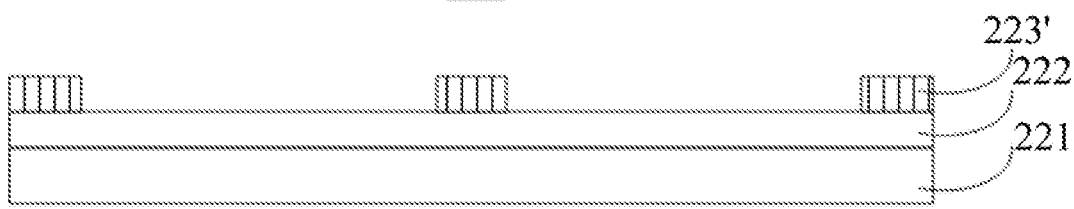
FIG. 3D
FIG. 3E

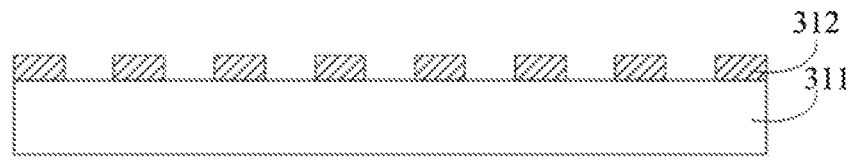
FIG. 5A
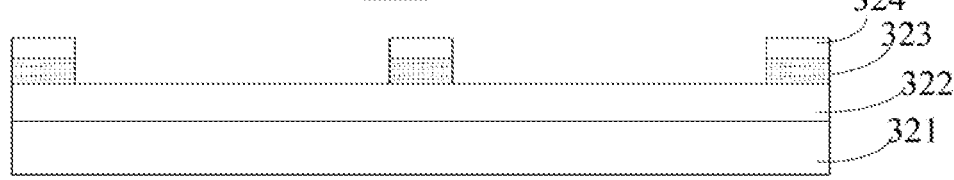
FIG. 5B
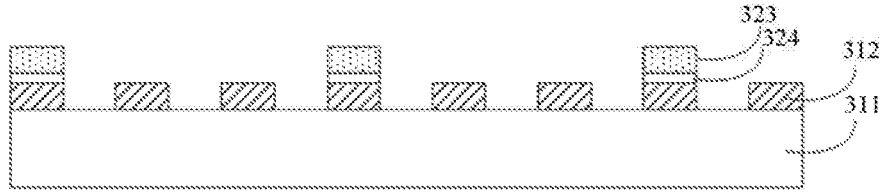
FIG. 5C
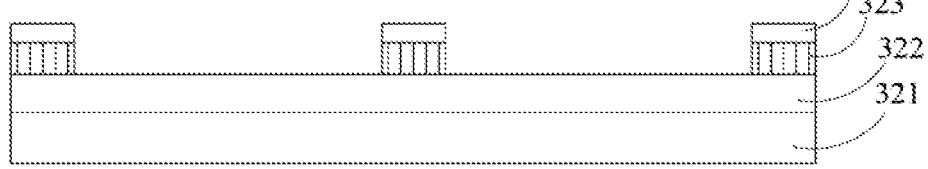
FIG. 5D
FIG. 5E

METHOD FOR MANUFACTURING LED DISPLAY DEVICE AND LED DISPLAY PANEL

CROSS-REFERENCE TO RELATED APPLICATIONS

The present application is a continuation-application of International (PCT) Patent Application No. PCT/CN2019/084386 filed on Apr. 25, 2019, which claims the foreign priority of Chinese Patent Application No. 2018110135747, filed on Aug. 31, 2018 in the National Intellectual Property Administration of China, the entire contents of which are hereby incorporated by reference in their entireties.

TECHNICAL FIELD

The present disclosure relates to the field of light emitting diode (LED) display devices, and particularly to a method for manufacturing an LED display device and an LED display device.

BACKGROUND

An LED display device may include a plurality of LED chips arranged in an array. An LED chip may be self-luminous to display content. As advantages, the LED chip may be in a completely solid state, may have a long service life, high luminosity, low power consumption, a small size, and ultra-high resolution, and may be applied in an extreme environment, such as an environment of high temperature or an environment with radiation. Currently, the LED chip may display a single color, and colorization of the LED chip may be essential to broaden applications of the LED chip.

A quantum dot (QD) is a rising semiconductor nanocrystal material. The QD may have a high quantum efficiency, a spectrum of the QD may be tunable accurately, and a color gamut of the QD may be wide. Application of the QD for display may dramatically increase a color gamut range for the display and reduce power consumption of the display. The QD is photoluminescent, and therefore, combining the LED chip with QDs of various colors may achieve the colorization of the LED chip.

SUMMARY OF THE DISCLOSURE

The present disclosure may provide a method for manufacturing a light emitting diode (LED) display device and an LED display device.

According to a first aspect of the present disclosure, a method for manufacturing a light emitting diode (LED) display device is provided and includes: providing an LED array substrate and a conversion plate, the LED array substrate includes a driving layer and a plurality of LED chips, the plurality of LED chips are arranged in an array on a side of the driving layer, the conversion layer includes a substrate and a plurality of light conversion blocks, and the plurality of light conversion blocks are spaced apart from each other and arranged on the substrate; fixing the plurality of light conversion blocks on corresponded top surfaces of the plurality of LED chips by adhering a side of the conversion plate having the plurality of light conversion blocks with the side of the LED array substrate having the plurality of LED chips correspondingly; and removing the substrate.

Optionally, the fixing the plurality of light conversion blocks on corresponded top surfaces of the plurality of LED chips includes: fixing the plurality of light conversion blocks on corresponded top surfaces of the plurality of LED chips via an adhesion layer.

Optionally, the LED array substrate includes a first glue layer covering the plurality of LED chips, the first glue layer forms the adhesion layer. The fixing the plurality of light conversion blocks on corresponded top surfaces of the plurality of LED chips via the adhesion layer includes: fixing the plurality of light conversion blocks on corresponded top surfaces of the plurality of LED chips via the first glue layer.

Optionally, the first glue layer is a layer of transparent glue, and a thickness of the first glue layer covering the plurality of LED chips is 5 μm to 10 μm.

Optionally, the first glue layer is arranged to cover the driving layer and the plurality of LED chips by any one of spraying, blade coating, or spin coating. The conversion plate includes a plurality of second glue blocks arranged on the plurality of light conversion blocks, and the plurality of second glue blocks form the adhesion layer. The fixing the plurality of light conversion blocks on corresponded top surfaces of the plurality of LED chips via the adhesion layer includes: fixing the plurality of light conversion blocks on corresponded top surfaces of the plurality of LED chips via the plurality of second glue blocks.

Optionally, the plurality of second glue blocks are transparent glue.

Optionally, the conversion plate includes a third glue layer covering the substrate, and the plurality of light conversion blocks are adhered to the substrate via the third glue layer.

Optionally, after the adhering the side of the conversion plate having the plurality of light conversion blocks with the side of the LED array substrate having the plurality of LED chips correspondingly, the method further includes: reducing stickiness of the third glue layer by ultraviolet irradiation or a heating process.

Optionally, the conversion plate includes a first conversion plate and a second conversion plate, the first conversion plate includes the plurality of light conversion blocks arranged spaced apart from each other, and the second conversion plate includes a plurality of light conversion blocks arranged spaced apart from each other. The plurality of first light conversion blocks are fixed on top surfaces of a part of the plurality of LED chips, the plurality of second light conversion blocks are fixed on top surfaces of another part of the plurality of LED chips, and the rest part of the plurality of LED chips are not covered by any first light conversion block or any second light conversion block.

Optionally, the plurality of LED chips are a plurality of blue LED chips, the plurality of light conversion blocks are a plurality of red quantum dots, and the plurality of second light conversion blocks are a plurality of green quantum dots.

According to another aspect of the present disclosure, an LED display device is provided and includes: an LED array substrate and a plurality of light conversion blocks arranged on the LED array substrate. The LED array substrate includes a driving layer and a plurality of LED chips, and the plurality of LED chips are arranged in an array on a side of the driving layer. The plurality of light conversion blocks are fixedly arranged on top surfaces of the plurality of LED chips correspondingly.

Optionally, an adhesion layer is further included. The plurality of light conversion blocks are fixedly arranged on corresponded top surfaces of the plurality of LED chips via the adhesion layer.

Optionally, the adhesion layer includes a first glue layer, arranged to cover the plurality of LED chips. Alternatively, the adhesion layer includes a plurality of second glue blocks, the plurality of second glue blocks are spaced apart from each other, and each second glue block is arranged between each light conversion block and a corresponded top surface of each LED chip.

Optionally, the plurality of LED chips include a first group of LED chips, a second group of LED chips, and a third group of LED chips. The plurality of light conversion blocks include a plurality of first light conversion blocks and a plurality of second light conversion blocks. The plurality of first light conversion blocks are fixed on top surfaces of the first group of LED chips via the first glue layer or the plurality of second glue blocks. The plurality of second light conversion blocks are fixed on top surfaces of the second group of LED chips via the first glue layer or the plurality of second glue blocks. Top surfaces of the third group of LED chips are not covered by any first light conversion block or any second light conversion block.

Optionally, the plurality of LED chips are a plurality of blue LED chip, the plurality of first light conversion blocks are a plurality of red quantum dots, and the plurality of second light conversion blocks are a plurality of green quantum dots.

Optionally, the LED array substrate includes the plurality of blue LED chips, arranged in an array. A red quantum dot, a green quantum dot, and a position without any quantum dot are arranged sequentially and repeatedly on the plurality of blue LED chips in the array.

Optionally, the first glue layer is a layer of transparent glue, and each of the plurality of second glue block is transparent glue.

According to the present disclosure, the method for manufacturing an LED display device and the LED display device are provided. An LED array substrate and a conversion plate are provided. The LED array substrate includes a driving layer and a plurality of LED chips, and the plurality of LED chips are arranged in an array on a side of the driving layer. The conversion plate includes a substrate and a plurality of light conversion blocks, and the plurality of light conversion blocks are arranged on the substrate spaced apart from each other. A side of the conversion plate having the plurality of light conversion blocks may be correspondingly adhered with the side of the LED array substrate having the plurality of LED chips, such that the plurality of light conversion blocks may be fixed on corresponded top surfaces of the plurality of LED chips. The substrate may be removed.

BRIEF DESCRIPTION OF THE DRAWINGS

FIG. 3B is a structural view of a first conversion plate of the LED display device during performing the method shown in FIG. 3.

FIG. 3C is a structural view of adhesion between the first conversion plate and the LED array substrate of the LED display device during performing the method shown in FIG. 3.

FIG. 3D is a structural view of the LED array substrate of the LED display device during performing the method shown in FIG. 3 after the substrate being removed.

FIG. 3E is a structural view of a second conversion plate of the LED display device during performing the method shown in FIG. 3.

FIG. 5A is a structural view of an LED array substrate of the LED display device during performing the method shown in FIG. 5.

FIG. 5B is a structural view of a first light conversion block of the LED display device during performing the method shown in FIG. 5.

FIG. 5C is a structural view of adhesion between a first conversion plate and the LED array substrate of the LED display device during performing the method shown in FIG. 5.

FIG. 5D is a structural view of the LED array substrate of the LED display device during performing the method shown in FIG. 5 after the substrate being removed.

FIG. 5E is a structural of a second conversion plate of the LED display device during performing the method shown in FIG. 5.

DETAILED DESCRIPTION

A certain term is used in the specification and claims of the present disclosure to indicate a certain element. It may be understood to any one of skill in the related art that, a manufacturer may use a different term to name the same certain element. The specification and the claims do not distinguish elements according to the term, but distinguish the elements based on a function of each element. The present disclosure may be illustrated in details by referring to drawings and embodiments.

Ink jet printing (IJP) is typically performed to coat a quantum dot (QD) onto a light emitting diode (LED) chip, such that the LED chip may be excited to emit red, green, and blue lights. The LED chip may be colorized by proportion of three color lights. However, applicant discovered that colorization of the LED chips with a high pixel density may not be achieved due to the limitation of printing accuracy. From another aspect, the high pixel density may result in a small size of each pixel, it may be difficult to coat the QD onto a small sized pixel by performing the IJP, and colorization may not be achieved.

Figure 1:
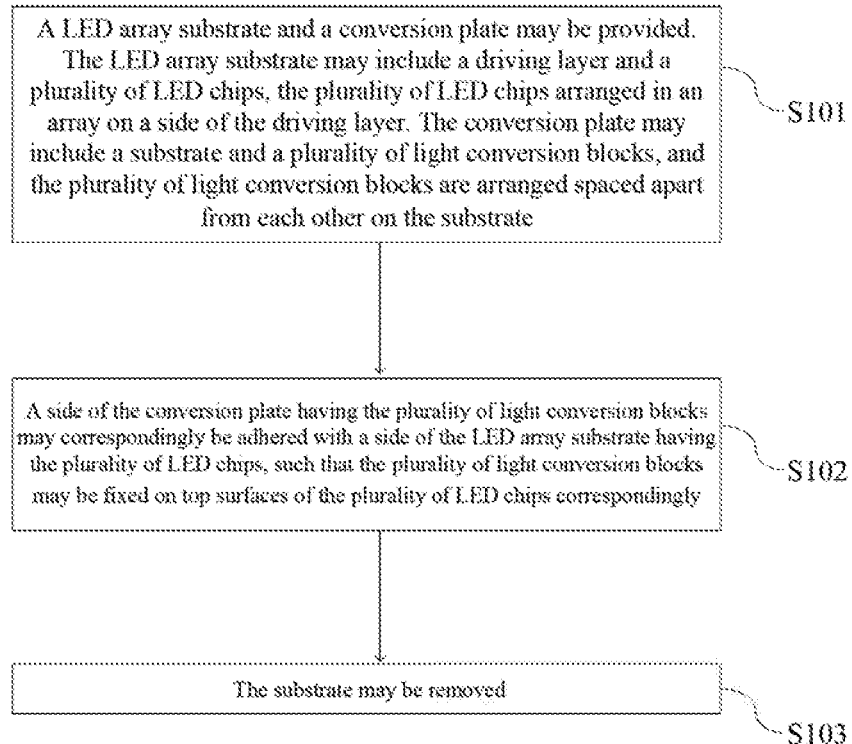
FIG. 1 is a flow chart of a method for manufacturing an LED display device according to a first embodiment of the present disclosure.

FIG. 1 is a flow chart of a method for manufacturing an LED display device according to a first embodiment of the present disclosure. To be noted that, to achieve a substantially identical outcome, an order of performing operations of the method shown in FIG. 1 may not be limited by the present disclosure. As shown in FIG. 1, the method may include following operations.

At S101, an LED array substrate and a conversion plate may be provided. The LED array substrate may include a driving layer and a plurality of LED chips, the plurality of LED chips arranged in an array on a side of the driving layer.

The conversion plate may include a substrate and a plurality of light conversion blocks, and the plurality of light conversion blocks are spaced apart from each other and arranged on the substrate.

In the operation of S101, a light conversion block may be a quantum dot (QD). The plurality of light conversion blocks arranged on the substrate may be a plurality of QDs in a same color or various colors.

For example, when the plurality of LED chips are a plurality of blue LED chips, the conversion plate may be provided, and a plurality of red QDs and a plurality of green QDs may be arranged on the substrate of the conversion plate at the same time. Alternatively, two conversion plates may be provided, the plurality of red QDs may be arranged on one of the two conversion plates, and the plurality of green QDs may be arranged on the other of the two conversion plates.

At S102, a side of the conversion plate having the plurality of light conversion blocks may correspondingly be adhered with the side of the LED array substrate having the plurality of LED chips, such that the plurality of light conversion blocks may be fixed on top surfaces of the plurality of LED chips correspondingly.

In the operation of S102, the plurality of light conversion blocks may be fixed on the top surfaces of the plurality of LED chips correspondingly by various means, for example, the plurality of light conversion blocks may be directly fixed on the top surfaces of the plurality of LED chips, or the plurality of light conversion blocks may be fixed on the top surfaces of the plurality of LED chips via an adhesion layer.

At S103, the substrate may be removed.

In the operation of S103, after the substrate is removed, the plurality of light conversion blocks may be transferred onto the top surfaces of the plurality of LED chips, such that colorization of the plurality of LED chips may be achieved.

Figure 2:
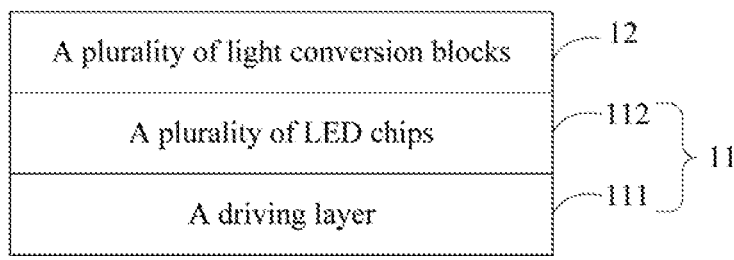
FIG. 2 is a structural view of the LED display device manufactured by the method shown in FIG. 1.

FIG. 2 is a structural view of the LED display device manufactured by the method shown in FIG. 1. As shown in FIG. 2, the LED display device may include the LED array substrate 11 and the plurality of light conversion blocks 12 arranged on the LED array substrate 11.

The LED array substrate 11 may include the driving layer 111 and the plurality of LED chips 112 arranged in an array on a side of the driving layer 111.

The plurality of light conversion blocks 12 may be fixedly arranged on top surfaces of the plurality of LED chips 112 correspondingly.

Figure 3:
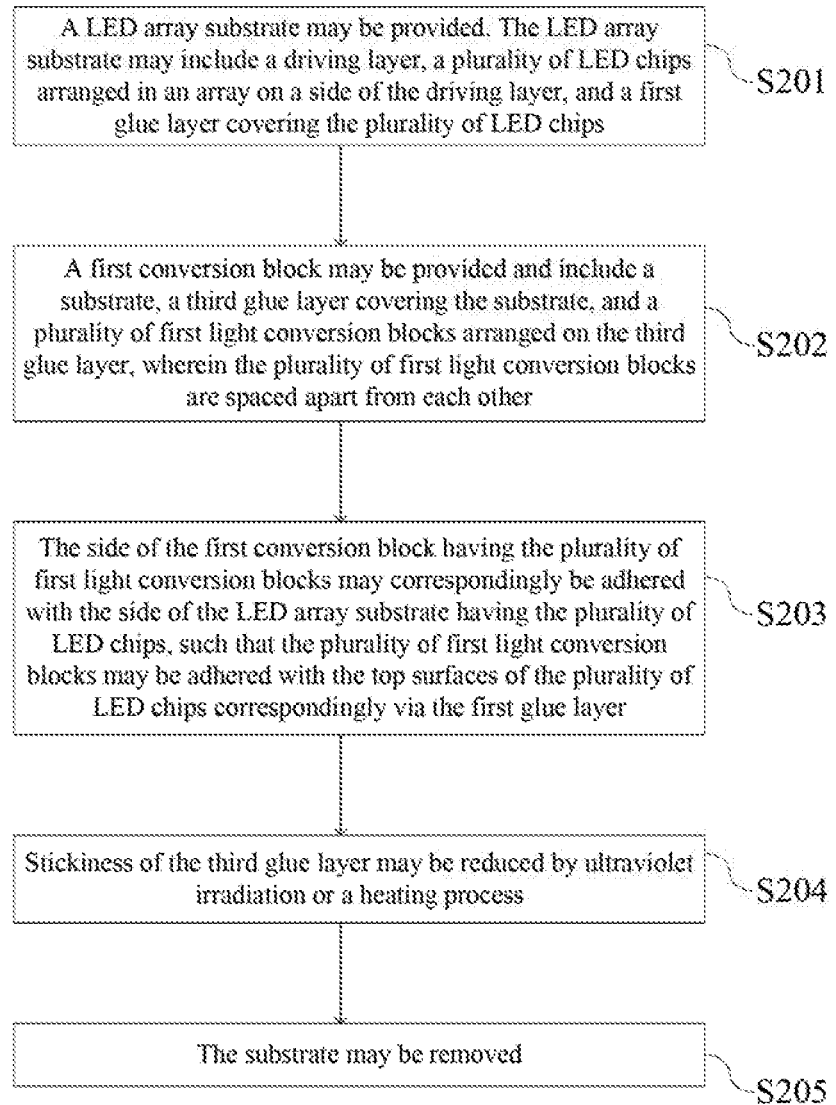
FIG. 3 is a flow chart of a method for manufacturing an LED display device according to a second embodiment of the present disclosure.

FIG. 3 is a flow chart of a method for manufacturing an LED display device according to a second embodiment of the present disclosure. FIGS. 3A to 3E are structural views of an LED array substrate and a conversion plate during performing the method shown in FIG. 3. In order to achieve a substantial identical outcome, an order of performing the operations of the method shown in FIG. 3 may not be limited by the present disclosure. As shown in FIG. 3, the method may include following operations.

At S201, an LED array substrate may be provided. The LED array substrate may include a driving layer, a plurality of LED chips arranged in an array on a side of the driving layer, and a first glue layer covering the plurality of LED chips.

Figure 3A:
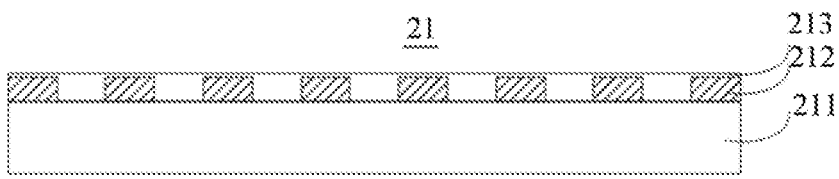
FIG. 3A is a structural view of an LED array substrate of the LED display device during performing the method shown in FIG. 3.

Referring to FIG. 3A, a structural view of the LED array substrate of the LED display device is provided. As shown in FIG. 3A, the LED array substrate 21 may include the driving layer 211, the plurality of LED chips 212, and the first glue layer 213.

The plurality of LED chips 212 may be arranged in an array on the driving layer 211, and the first glue layer 213 may be arranged to cover the plurality of LED chips 212. In the present embodiment, the first glue layer 213 may form an adhesion layer. The first glue layer 213 may be a layer of transparent glue. A thickness of the first glue layer 213 on the plurality of LED chips 212 may be 5 μm to 10 μm.

In the present embodiment, the first glue layer 213 may be arranged to cover the driving layer 211 and the plurality of LED chips 212 by any one of spraying, blade coating, and spin coating.

In the present embodiment, the plurality of LED chips 212 may be a plurality of blue LED chips, and may be formed on the driving layer 211 by thermal evaporation or by epitaxial growth.

At S202, a first conversion block may be provided and include a substrate, a third glue layer covering the substrate, and a plurality of first light conversion blocks arranged on the third glue layer, wherein the plurality of first light conversion blocks are spaced apart from each other.

As shown in FIG. 3B, a structural view of the first conversion plate of the LED display device is provided. As shown in FIG. 3B, the first conversion plate 22 may include the substrate 221, the third glue layer 222, and the plurality of first light conversion blocks 223.

The third glue layer 222 may cover the substrate 221. The plurality of first light conversion blocks 223 may be spaced apart from each other and arranged on the third glue layer 222, and may be adhered with the substrate 221 via the third glue layer 222.

A material of the substrate 221 may include, but may not be limited to, any one of glass, quartz, polyethylene terephthalate (PET), silicon, sapphire, or indium tin oxide. In the present embodiment, the substrate 221 may be a glass substrate.

In the present embodiment, the third glue layer 222 may be arranged to cover the substrate 221 by any one of spraying, blade coating, or spin coating.

In the present embodiment, the plurality of first light conversion blocks 223 may be a plurality of red QDs. The operation of forming the plurality of red QDs spaced apart from each other on the third glue layer may include following operations. A red QD layer may be arranged on the third glue layer. The red QD layer may be arranged to cover the third glue layer by any one of laser printing, IJP, impressing, spraying, or spin spraying. The red QD layer may be a layer of QD solution, a layer of QD powder, or a layer of QD-polymer powder. The QD layer may be patterned to form the plurality of red QDs spaced apart from each other. The patterning is a conventional process known in the art, and will not be described herein.

At 203, the side of the first conversion block having the plurality of first light conversion blocks may correspondingly be adhered with the side of the LED array substrate having the plurality of LED chips, such that the plurality of first light conversion blocks may be adhered on the top surfaces of the plurality of LED chips correspondingly via the first glue layer.

Referring to FIG. 3C, a structural view of the adhesion between the first conversion plate and the LED array substrate of the LED display device is provided. As shown in FIG. 3C, the first conversion plate 22 may be arranged on the LED array substrate 21, and the plurality of first light conversion plate 223 face towards the plurality of LED chips 212, such that the plurality of first light conversion blocks 223 may be adhered on the top surfaces of the plurality of LED chips 212 correspondingly via the first glue layer 213.

At S204, stickiness of the third glue layer may be reduced by ultraviolet irradiation or a heating process.

In the operation of S204, after the ultraviolet irradiation or the heating process, the stickiness of the third glue layer 222 may be dramatically reduced, such that the stickiness of the third glue layer 222 may be significantly less than stickiness of the first glue layer 213. From another aspect, the first glue layer 213 and the third glue layer 222 may include different materials. Stability of the stickiness of the first glue layer 213 is greater than stability of the stickiness of the third glue layer 222, such that the stickiness of the first glue layer 213 may not be significantly changed after the ultraviolet irradiation or the heating process, whereas the stickiness of the third glue layer 222 may be significantly reduced after the ultraviolet irradiation or the heating process.

At S205, the substrate may be removed.

In the operation of S205, after performing the ultraviolet irradiation or the heating process to the third glue layer 222, the stickiness of the first glue layer 213 is significantly greater than the stickiness of the third glue layer 222. After the substrate 221 is removed, the plurality of first light conversion blocks 223 may be transferred from the first conversion plate 22 onto the corresponded top surfaces of the plurality of LED chips.

Referring to FIG. 3D, a structural view of the LED array substrate of the LED display device with the substrate removed is provided. As shown in FIG. 3D, the LED army substrate 21 may be arranged with the plurality of first light conversion blocks 223, and the plurality of first light conversion blocks 223 may be fixed onto the corresponded top surfaces of the plurality of LED chips 212 via the first glue layer 213.

In the present embodiment, the first conversion plate may be replaced by a second conversion plate, and the operations of S202 to S205 may be performed again to obtain the LED display device.

Referring to FIG. 3E, a structural view of the second conversion plate of the LED display device is provided. As shown in FIG. 3E, a difference between the second conversion plate 23 and the first conversion plate 22 may include following aspects. The second conversion plate 23 may include a plurality of second light conversion blocks 223', spaced apart from each other, and the first conversion plate 22 may include the plurality of first light conversion blocks 223, spaced apart from each other. The plurality of second light conversion blocks 223' may be a plurality of green QDs, and the plurality of first light conversion blocks 223 may be a plurality of red QDs. The plurality of second light conversion blocks 223' may correspond to a part of the plurality of LED chips 212, and the plurality of first light conversion blocks 223 may correspond to another part of the plurality of LED chips 212, and the rest part of the plurality of LED chips 212 may not correspond to any first light conversion block 223 or any second light conversion block 223'.

It may be understood to any one of skill in the related art that, in other embodiments, the first conversion plate 22 and the second conversion plate 23 may not be arranged with the third glue layer 222, the operation of S204 may not be performed twice, and such an embodiment is within the scope of the present disclosure. Alternatively, the first conversion plate 22 may be arranged with the third glue layer 222, and the second conversion plate 23 may not be arranged with the third glue layer 222. Alternatively, the first conversion plate 22 may not be arranged with the third glue layer 222, and the second conversion plate 23 may be arranged with the third glue layer 222. Under such situations, the operation of S204 may be performed once only, and the embodiments are within the scope of the present disclosure.

In the present embodiment, the plurality of first light conversion blocks 223 may be formed on the first conversion plate 22, and the plurality of second conversion blocks 223' may be formed on the second conversion plate 23, such that interference between patterning the QDs in various colors may be reduced, improving yield rate of the patterning.

Figure 4:
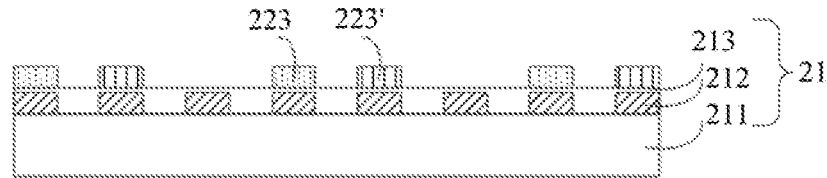
FIG. 4 is a structural view of the LED display device manufactured by the method shown in FIG. 3.

FIG. 4 is a structural view of the LED display device manufactured by the method shown in FIG. 3. As shown in FIG. 4, the LED display device may include the LED array substrate 21, the plurality of first light conversion blocks 223 arranged on the LED array substrate 21, and the plurality of second light conversion blocks 223' arranged on the LED array substrate 21.

The LED array substrate 21 may include the driving layer 211, the plurality of LED chips 212 arranged in an array on a side of the driving layer 211, and the first glue layer 213 arranged to cover the plurality of LED chips 212.

The plurality of first light conversion blocks 223 may be fixed on top surfaces of a part of the plurality of LED chips 212, the plurality of second light conversion blocks 223' may be fixed on top surfaces of another part of the plurality of LED chips 212, and top surfaces of the rest part of the plurality of LED chips 212 may not be cover by any first light conversion block 223 or any second light conversion block 223'.

In the present embodiment, the plurality of LED chips 212 are a plurality of blue LED chips, the plurality of first light conversion blocks 223 may be a plurality of red QDs, and the second light conversion blocks 223' may be a plurality of green QDs.

In the present embodiment, the LED array substrate may include a plurality of blue LED chips arranged in an array, and a red QD, a green QD, and a position without any light conversion block may be arranged sequentially and repeatedly on the plurality of blue LED chips.

In the present embodiment, the first glue layer 213 may be a layer of transparent glue, and a thickness of the first glue layer 213 on the plurality of LED chips 212 may be 51 μm to 10 μm.

Figure 5:
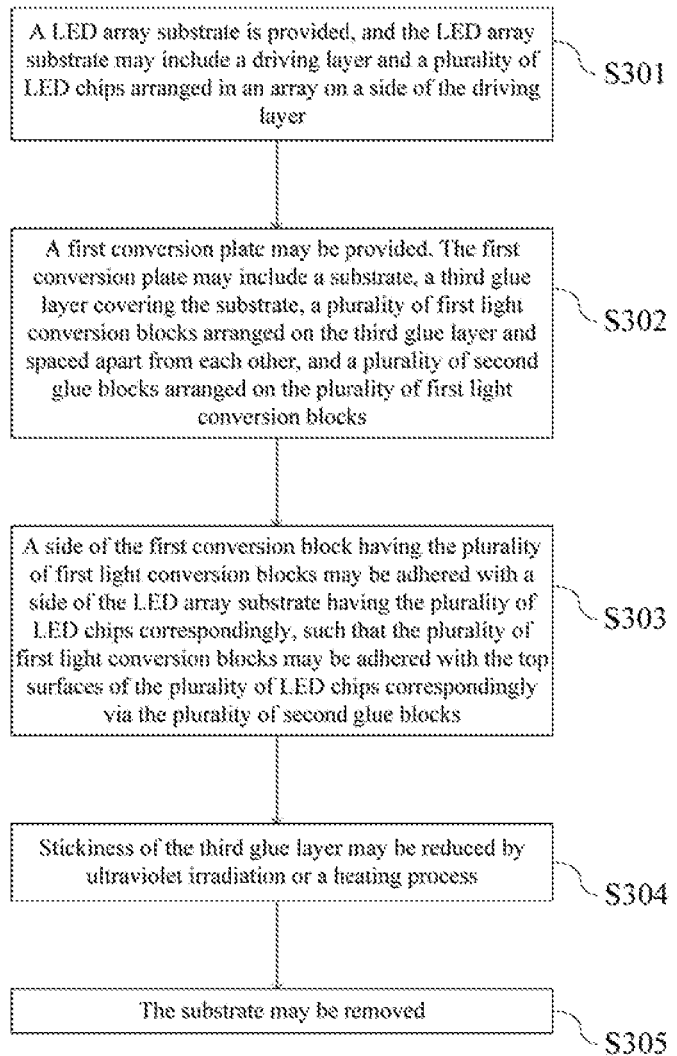
FIG. 5 is a flow chart of a method for manufacturing an LED display device according to a third embodiment of the present disclosure.

FIG. 5 is a flow chart of a method for manufacturing an LED display device according to a third embodiment of the present disclosure. FIGS. SA to SE are structural views of an LED array substrate and a conversion plate during performing the method shown in FIG. 5. In order to achieve a substantially identical outcome, an order of performing the operations of the method shown in FIG. 5 may not be limited by the present disclosure. As shown in FIG. 5, the method may include following operations.

At S301, the LED array substrate is provided, and the LED array substrate may include a driving layer and a plurality of LED chips arranged in an array on a side of the driving layer.

Referring to FIG. 5A, a structural view of the LED array substrate of the LED display device is provided. As shown in FIG. 5A, the LED array substrate 31 may include the driving layer 311 and the plurality of LED chips 312.

The plurality of LED chips 312 may be arranged in an array on the driving layer 311.

In the present embodiment, the plurality of LED chips 312 may a plurality of blue LED chips, and the plurality of LED chips may be formed on the driving layer 311 by thermal evaporation or by epitaxial growth.

At S302, a first conversion plate may be provided. The first conversion plate may include a substrate, a third glue layer covering the substrate, a plurality of first light conversion blocks arranged on the third glue layer and spaced apart from each other, and a plurality of second glue blocks arranged on the plurality of first light conversion blocks.

Referring to FIG. 5B, a structural view of the first light conversion block of the LED display device is provided. As shown in FIG. 5B, the first conversion block 32 may include the substrate 321, the third glue layer 322, the plurality of first light conversion blocks 323, and the plurality of second glue blocks 324.

The third glue layer 322 may be arranged to cover the substrate 321, the plurality of first light conversion blocks 323 may be arranged on the third glue layer and spaced apart from each other, and the plurality of first light conversion blocks 323 may be adhered to the substrate 321 via the third glue layer 322. The plurality of second glue blocks 324 may be arranged on the plurality of first light conversion blocks 323 correspondingly.

In the present embodiment, the plurality of second glue blocks 324 may form an adhesion layer, and the plurality of second glue blocks 324 may be transparent glue.

A material of the substrate 321 may include, but may not be limited to, at least one of glass, quartz, PET, silicon, sapphire, or indium tin oxide. In the present embodiment, the substrate 321 may be a glass substrate.

In the present embodiment, the plurality of first light conversion blocks 323 may be a plurality of red QDs.

In the present embodiment, the operation of providing the first conversion block 32 may include following operations. The substrate 321 may be provided. The third glue layer 322 may be arranged on the substrate 321, and the third glue layer 222 may be arranged to cover the substrate 321 by any one of spraying, blade coating, or spin coating. A red QD layer may be arranged on the third glue layer 322, and the red QD layer may be arranged to cover the third glue layer by any one of laser printing, IJP, impressing, spraying, or spin coating. The red QD layer may be a layer of QD solution, a layer of QD powder, or a layer of QD-polymer powder. A second glue layer may be arranged on the red QD layer. The second glue layer may be arranged to cover the red QD layer by any one of spraying, blade coating, or spin coating. Patterning may be performed to the red QD layer and the second glue layer to form the plurality of red QDs spaced apart from each other, and that is the plurality of first light conversion blocks 323 and the plurality of second glue blocks 324. The patterning may be a conventional process known in the art, and will not be described herein.

At S303, a side of the first conversion block having the plurality of first light conversion blocks may be adhered with a side of the LED array substrate having the plurality of LED chips correspondingly, such that the plurality of first light conversion blocks may be adhered on corresponded top surfaces of the plurality of LED chips via the plurality of second glue blocks.

Referring to FIG. 5C, a structural view of the adhesion between the first conversion plate and the LED array substrate of the LED display device is provided. As shown in FIG. 5C, the first conversion plate 32 may be arranged on the LED array substrate 31, and the plurality of light conversion blocks 323 may face towards the plurality of LED chips 312, such that the plurality of first light conversion blocks 323 may be adhered to corresponded top surfaces of the plurality of LED chips via the plurality of second glue blocks 324.

At S304, stickiness of the third glue layer may be reduced by ultraviolet irradiation or a heating process.

In the operation of S304, the stickiness of the third glue layer 322 may be significantly reduced after the ultraviolet irradiation and the heating process, such that the stickiness of the third glue layer 322 may be significantly less than stickiness of the plurality of second glue blocks 324. That is, a material of the plurality of second glue blocks 324 may be different from a material of the third glue layer 322, and stability of the stickiness of the plurality of second glue blocks 324 is greater than stability of the stickiness of the third glue layer 322.

At S305, the substrate may be removed.

In the operation of S305, after performing the ultraviolet irradiation or the heating process to the third glue layer 322, the stickiness of the plurality of second glue blocks 324 is significantly greater than the stickiness of the third glue layer 322. After the substrate 321 is removed, the plurality of first light conversion blocks 323 may be transferred from the first conversion plate 32 onto corresponded top surfaces of the plurality of LED chips.

Referring to FIG. 5D, a structural view of the LED array substrate of the LED display device with the substrate removed is provided. As shown in FIG. 5D, the LED array substrate 31 may be arranged with the plurality of first light conversion blocks 323, and each first light conversion block 323 may be fixed onto a surface of a corresponded LED chip 312 via each second glue block 324.

In the present embodiment, the first conversion plate 31 may be replaced by a second conversion plate 32, and the operations of S302 to S305 may be performed repeatedly to obtain the LED display device.

Referring to FIG. 5E, a structural of the second conversion plate 32 of the LED display device is provided. As shown in FIG. 5E, a difference between the second conversion plate 33 and the first conversion plate 32 may include following aspects. The second conversion plate 33 may include a plurality of second light conversion blocks 323', spaced apart from each other, and the first conversion plate 32 may include the plurality of first light conversion blocks 323, spaced apart from each other. The plurality of second light conversion blocks 323' may be a plurality of green QDs, and the plurality of first light conversion blocks 323 may be a plurality of red QDs. The plurality of second light conversion blocks 323' may correspond to a part of the plurality of LED chips 312, the plurality of first light conversion blocks 323 may correspond to another part of the plurality of LED chips 312, and the rest part of the plurality of LED chips 312 may not correspond to any first light conversion block 323 or any second light conversion block 323'.

In other embodiments, the first conversion plate 32 and the second conversion plate 33 may not be arranged with the third glue layer 322, the operation of S304 may not be performed twice, and such an embodiment is within the scope of the present disclosure. Alternatively, the first conversion plate 32 may be arranged with the third glue layer 322, and the second conversion plate may not be arranged with the third glue layer 322. Alternatively, the first conversion plate 32 may not be arranged with the third glue layer 322, and the second conversion layer 33 may be arranged with the third glue layer 322. For these embodiments, the operation of S304 may be performed once only, and these embodiments are within the scope of the present disclosure.

In the present embodiment, the plurality of first light conversion blocks 323 may be formed on the first conversion plate 32, and the plurality of second light conversion blocks 323' may be formed on the second conversion plate 33. In such a way, interference between patterning the QDs in various colors may be reduced, improving yield rate of the patterning.

Figure 6:
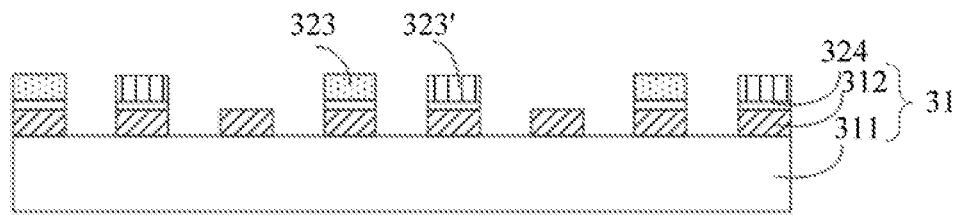
FIG. 6 is a structural view of the LED display device manufactured by the method shown in FIG. 5.

FIG. 6 is a structural view of the LED display device manufactured by the method shown in FIG. 5. As shown in FIG. 6, the LED display device may include the LED array substrate 31, the plurality of first light conversion blocks 323 arranged on the LED array substrate 31, the plurality of second light conversion blocks 323' arranged on the LED array substrate 31, and the plurality of second glue blocks 324. The plurality of second glue blocks 324 may be arranged to fix the plurality of first light conversion blocks 323 and the plurality of second light conversion blocks 323' onto the LED array substrate 31.

The LED array substrate 31 may include the driving layer 311 and the plurality of LED chips 312 arranged in an array on a side of the driving layer 311.

The plurality of first light conversion blocks 323 may be fixed onto top surfaces of a part of the plurality of LED chips 312 via the plurality of second glue blocks 324. The plurality of second light conversion blocks 323' may be fixed onto top surfaces of another part of the plurality of LED chips 312 via the plurality of second glue blocks 324. The rest part of the plurality of LED chips 312 may not be covered by any first light conversion block 323 or any second light conversion block 323'.

In the present embodiment, the plurality of LED chips 312 may be a plurality of blue LED chips, the plurality of first light conversion blocks 323 may be a plurality of red QDs, the plurality of second light conversion blocks 323' may be a plurality of green QDs, and the plurality of second glue blocks 324 may be transparent glue.

In the present embodiment, a red QD+a blue LED chip, a green QD+a blue LED chip, and a blue chip may be sequentially arranged in the LED display device, and such a sequence may appear repeatedly in the LED display device.

According to the present disclosure, a method for manufacturing an LED display device and an LED display device are provided. An LED array substrate and a conversion plate may be provided. The LED array substrate may include a driving layer and a plurality of LED chips arranged in an array on a side of the driving layer. The conversion plate may include a substrate and a plurality of light conversion blocks, and the plurality of light conversion blocks are arranged on the substrate and spaced apart from each other. A side of the conversion plate having the plurality of light conversion blocks may be correspondingly adhered with the a side of the LED array substrate having the plurality of LED chips, such that the plurality of light conversion blocks may be fixed on top surfaces of the plurality of LED chips correspondingly via an adhesion layer. The substrate may be removed. In such a way, colorization of LED chips in a high pixel density may be achieved easily.

The above descriptions are for the purposes of illustrating implementations of the present disclosure, but not to limit the scope of the present disclosure. Any equivalent structural or process transformation performed based on the specification and drawings of the present disclosure, directly or indirectly applied in other related arts, shall be within the scope of the present disclosure.

What is claimed is:

1. A method for manufacturing a light emitting diode (LED) device, comprising:
providing an LED array substrate and a conversion plate, wherein, the LED array substrate comprises a driving layer and a plurality of LED chips, the plurality of LED chips are arranged in an array on a side of the driving layer, the conversion layer comprises a substrate and a plurality of light conversion blocks, the plurality of light conversion blocks are spaced apart from each other and arranged on the substrate; and
fixing the plurality of light conversion blocks on corresponded top surfaces of the plurality of LED chips by adhering a side of the conversion plate having the plurality of light conversion blocks with the side of the LED array substrate having the plurality of LED chips correspondingly; and
removing the substrate,
wherein fixing the plurality of light conversion blocks on corresponded top surfaces of the plurality of LED chips further comprises: fixing the plurality of light conversion blocks on corresponded top surfaces of the plurality of LED chips via an adhesion layer,
wherein:
the LED array substrate further comprises a first glue layer covering the plurality of LED chips, wherein the first glue layer forms the adhesion layer; and
fixing the plurality of light conversion blocks on corresponded top surfaces of the plurality of LED chips via the adhesion layer further comprises: fixing the plurality of light conversion blocks on corresponded top surfaces of the plurality of LED chips via the first glue layer.

2. The method of claim 1, wherein the first glue layer is a layer of transparent glue, and a thickness of the first glue layer covering the plurality of LED chips is 5 µm~10 µm.

3. The method of claim 2, wherein the first glue layer is arranged to cover the driving layer and the plurality of LED chips by at least one of spraying, blade coating, or spin coating.

4. The method of claim 1, wherein the conversion plate comprises a plurality of second glue blocks arranged on the plurality of light conversion blocks, and the plurality of second glue blocks form the adhesion layer; and
fixing the plurality of light conversion blocks on corresponded top surfaces of the plurality of LED chips via the adhesion layer further comprises: fixing the plurality of light conversion blocks on corresponded top surfaces of the plurality of LED chips via the plurality of second glue blocks.

5. The method of claim 4, wherein the plurality of second glue blocks are transparent glue.

6. The method of claim 1, wherein the conversion plate comprises a third glue layer covering the substrate, and the plurality of light conversion blocks are adhered to the substrate via the third glue layer.

7. The method of claim 6, after the adhering the side of the conversion plate having the plurality of light conversion blocks with the side of the LED array substrate having the plurality of LED chips correspondingly, further comprising:
Reducing stickiness of the third glue layer by ultraviolet irradiation or a heating process.

8. The method of claim 1, wherein the conversion plate comprises a first conversion plate and a second conversion plate, the first conversion plate comprises the plurality of light conversion blocks arranged spaced apart from each other, and the second conversion plate comprises a plurality of light conversion blocks arranged spaced apart from each other,
wherein, the plurality of first light conversion blocks are fixed on top surfaces of a part of the plurality of LED chips, the plurality of second light conversion blocks are fixed on top surfaces of another part of the plurality of LED chips, and the rest part of the plurality of LED chips are not covered by any first light conversion block or any second light conversion block.

9. The method of claim 8, wherein the plurality of LED chips are a plurality of blue LED chips, the plurality of light conversion blocks are a plurality of red quantum dots, and the plurality of second light conversion blocks are a plurality of green quantum dots.

10. A light emitting diode (LED) display device, comprising:
   an LED array substrate and a plurality of light conversion blocks arranged on the LED array substrate; and
   an adhesion layer, wherein the plurality of light conversion blocks are fixedly arranged on corresponding top surfaces of the plurality of LED chips via the adhesion layer,
   wherein, the LED array substrate comprises a driving layer and a plurality of LED chips, the plurality of LED chips are arranged in an array on a side of the driving layer; and
   the plurality of light conversion blocks are fixedly arranged on top surfaces of the plurality of LED chips correspondingly,
   wherein:
   the adhesion layer comprises a first glue layer, arranged to cover the plurality of LED chips; or
   the adhesion layer comprises a plurality of second glue blocks, the plurality of second glue blocks are spaced apart from each other, and each second glue bock is arranged between each light conversion block and a corresponded top surface of each LED chip.

11. The LED display device of claim 10, wherein
   the plurality of LED chips comprise a first group of LED chips, a second group of LED chips, and a third group of LED chips;
   the plurality of light conversion blocks comprise a plurality of first light conversion blocks and a plurality of second light conversion blocks;
   the plurality of first light conversion blocks are fixed on top surfaces of the first group of LED chips via the first glue layer or the plurality of second glue blocks;
   the plurality of second light conversion blocks are fixed on top surfaces of the second group of LED chips via the first glue layer or the plurality of second glue blocks; and
   top surfaces of the third group of LED chips are not covered by any first light conversion block or any second light conversion block.

12. The LED display device of claim 11, wherein the plurality of LED chips are a plurality of blue LED chip, the plurality of first light conversion blocks are a plurality of red quantum dots, and the plurality of second light conversion blocks are a plurality of green quantum dots.

13. The LED display device of claim 12, wherein
   the LED array substrate comprises the plurality of blue LED chips, arranged in an array; and
   a red quantum dot, a green quantum dot, and a position without any quantum dot are arranged sequentially and repeatedly on the plurality of blue LED chips in the array.

14. The LED display device of claim 10, wherein the first glue layer is a layer of transparent glue, and each of the plurality of second glue block is transparent glue.

* * * * *